United States Patent [19]

Putzer

[11] 3,866,138

[45] Feb. 11, 1975

[54] CIRCUIT ARRANGEMENT FOR AN OSCILLATOR FOR AT LEAST TWO FREQUENCY RANGES AND ITS USE AS A SELF-OSCILLATING MIXER STAGE

[75] Inventor: Walter Putzer, Krefeld, Germany

[73] Assignee: U.S. Philips Corporation, New York, N.Y.

[22] Filed: Nov. 15, 1973

[21] Appl. No.: 416,075

[30] Foreign Application Priority Data

Nov. 24, 1972 Germany ............................ 2257574

[52] U.S. Cl. .................... 331/60, 325/453, 325/459, 325/462, 331/117 R, 331/177 V, 331/179, 334/15

[51] Int. Cl. ............................ H03b 5/12, H03j 5/24

[58] Field of Search.. 331/60, 117 R, 177 R, 177 V, 331/179; 334/15; 325/453, 459, 462, 464

[56] References Cited

UNITED STATES PATENTS

| | | | |
|---|---|---|---|
| 3,559,075 | 1/1971 | Okazaki | 325/459 |
| 3,564,423 | 2/1971 | Putzer | 325/458 |
| 3,624,514 | 11/1971 | Putzer | 334/15 X |

*Primary Examiner*—Siegfried H. Grimm

*Attorney, Agent, or Firm*—Frank R. Trifari; Henry I. Steckler

[57] ABSTRACT

An oscillator circuit can oscillate in several frequency ranges due to multiple feedback paths and resonant circuits. Each of the circuits has a varicap diode for tuning. A fixed bias is applied to at least one of the diodes so that a single tuning voltage can be used.

11 Claims, 4 Drawing Figures

CIRCUIT ARRANGEMENT FOR AN OSCILLATOR FOR AT LEAST TWO FREQUENCY RANGES AND ITS USE AS A SELF-OSCILLATING MIXER STAGE

The invention relates to a circuit arrangement for an oscillator for at least two frequency ranges including an amplifying element in which a frequency-determining tuning circuit with an associated tuning element is connected to the output electrode for each frequency range, the tuning elements being variable capacity diodes all of which are commonly operated, a capacitive feedback path being provided for each tuning circuit which path leads from a point of the relevant tuning circuit to a parallel resonant circuit a branch of which incorporates the input electrodes of the amplifying element, the values of the circuit elements in the parallel resonant circuit and in the feedback path being chosen to be such that every time the oscillation conditions are satisfied only in one part of the tuning range of each resonant circuit.

Such oscillator circuits are especially required for the input section of televison receivers. As is known television receiver frequencies are subdivided in various bands. To reduce the cost an oscillator is to be used possibly for several bands. In order that the oscillator oscillates only in the desired frequency range, special steps are required. To this end resonant circuits or separate frequency-determining elements of the oscillator circuit are switched over in known apparatus.

In the input section of television receivers variable capacity diodes are generally used as tuning elements whose capacitance is variable by means of a voltage. Such variable capacity diodes are, however, also partly used for switching over the resonant circuits for the different receiver bands.

An oscillator circuit is also known in which only a tuning voltage is necessary because the oscillator automatically changes to the adjacent frequency range at a given point of the tuning voltage when the tuning voltage continuously varies. This is achieved in that each frequency range has its own resonant circuit with a special feedback path which feedback paths are only active in a given desired frequency range by the use of extra filters. These filters require, however, certain costs because minimum requirements are to be imposed thereon when faultless switching over from one frequency range to the other is to be ensured.

In the German published Patent application No. 2,116,901 which corresponds to U.S. Pat. No. 3,745,480 the object was to provide a circuit arrangement with which the automatic change-over from one frequency range to the other at a given tuning voltage involves less cost. This was achieved in that a capacitive feedback path is provided for each resonant circuit which path leads from a point of the relevant tuning circuit to a parallel resonant circuit a branch of which incorporates the input electrodes of the amplifying element, and in that the values of circuit elements in the feedback path are chosen to be such that every time the oscillation conditions are satisfied only in a part of the tuning range of each tuning circuit. In this manner an oscillator circuit is obtained with which a change-over from one frequency range to the other is made possible at low cost. This oscillator circuit may alternatively be used very advantageously as a self-oscillating mixer stage in which the input signal of each frequency range is applied to the end of the feedback path remote from the associated frequency-determining tuning circuit. As a result the input signals of the separate frequency ranges can influence or damp each other to a lesser extent.

This invention relates to an improvement of such a circuit arrangement. In fact, it was found that different band limits exist in the various countries for the ranges in which the television broadcasts are transmitted. For example, the lower channel central frequency in Germany for band I is 51 MHz, 65 MHz for the upper band, in band III the lower channel central frequency is 178 MHz and in the upper one it is 227 MHz. The same frequency limits in band III apply to Italy, but band I ranges from 56.5 MHz to 85 MHz so the frequency range is 14.5 MHz broader. When a tuning unit with an oscillator circuit according to the above-mentioned Patent Application is constructed, difficulties occur because when using the empty space in the region between band I and band III a voltage variation only remains for the upper frequency range (band III) which leads to only a slight capacity variation, in other words, in band I a capacity variation of 8 pF at a voltage variation of 3 V is reached while in band III a capacity variation of only 5 pF is achieved with a voltage variation of 19 V.

It is an object of the invention to provide means with which it is possible to achieve a greater capacity variation in the higher frequency ranges. A further object is to provide a simple circuit arrangement which is suitable for three frequency ranges in which two frequency ranges are located in the VHF range, hence band I and band III and a frequency range in the UHF range, hence band IV or V or bands IV and V.

According to the invention this object is achieved in that in the circuit arrangement of the above-mentioned kind at least one variable capacity diode is not only connected to the tuning voltage $U_A$ but also to a fixed bias $U_{V1}$; $U_{V2}$. The bias $U_{V1}$; $V_{V2}$ may be applied through the inductor of the relevant tuning circuit. According to a further aspect of the invention the bias is applied, to the variable capacity diode through a diode which, viewed in the direction of the direct current path is arranged in the opposite direction with respect to the relevant variable capacity diode. When the tuning voltage is higher than the bias, no voltage will occur across this diode and the difference between the tuning voltage and the bias will occur across the variable capacity diode; when the tuning voltage is lower than the bias no voltage will occur across the variable capacity diode and the difference between bias and tuning voltage will be present across the said diode while this diode prevents a direct current from flowing through the variable capacity diode and hence influences the tuning voltage. The frequency-determining elements in the tuning circuits may be proportioned in such a manner that any tuning circuit is active in the steepest possible part of the capacity variation curve of the associated variable capacity diode. A capacitor may be connected to the connection between variable capacity diode and bias diode which capacitor short-circuits the resonant circuit itself or the current circuit between the resonant circuit and the amplifying element; for the charge or discharge of this capacitor a resistor may be required between this connection and a point of suitable direct voltage.

Furthermore such an impedance relative to ground may be connected to the input of the amplifying element that this impedance constitutes a parallel resonant circuit with the own impedance of the amplifying element whose central frequency is located in the highest frequency range of the oscillator frequency to be generated while the feedback capacitor is chosen to be such that the oscillation conditions are no longer satisfied below the lowest oscillator frequency to be generated in this frequency range.

The values of the circuit elements of the resonant circuit located in the feedback path of the lowest frequency range may be chosen to be such that they constitute a parallel resonant circuit with a narrow band whose central frequency is located so far below the highest frequency of the range to be generated that the oscillation conditions are no longer satisfied below this highest frequency to be generated. The capacitance of the frequency-determining tuning circuit for at least the lowest frequency range may consist of the series arrangement of a variable capacitor and a fixed capacitor connected to ground and the feedback path may be connected to the junction of the two capacitors. Furthermore the input signal of each frequency range may be applied to the end of the feedback capacitor remote from the associated frequency-determining tuning circuit.

A so-called television tuner which is formed in accordance with the invention is not only suitable for use for the Italian television standard but also suitable for use as a tuner for the total range of television signals, hence for VHF and UHF in case of a corresponding construction of the frequency-determining elements in each tuning circuit.

The invention will be further described with reference to the Figures.

FIG. 1 shows the graph for the variable capacity diode-capacitor as a function of the tuning voltage for a tuner having two ranges for band I and band III according to the existing German published Patent application 2,116,901.

FIG. 2 likewise as FIG. 1 shows a similar graph for a tuning unit two ranges for band I and band III using the invention but without optimum proportioning of the frequeny-determining elements in the resonant circuit for band III.

Figure 1:
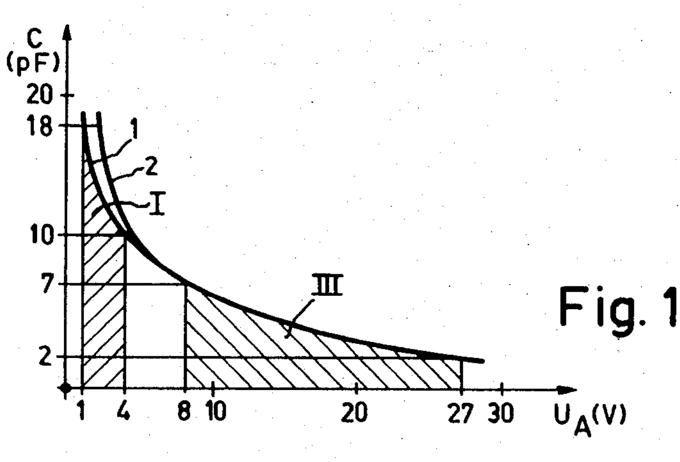
Figure 4:
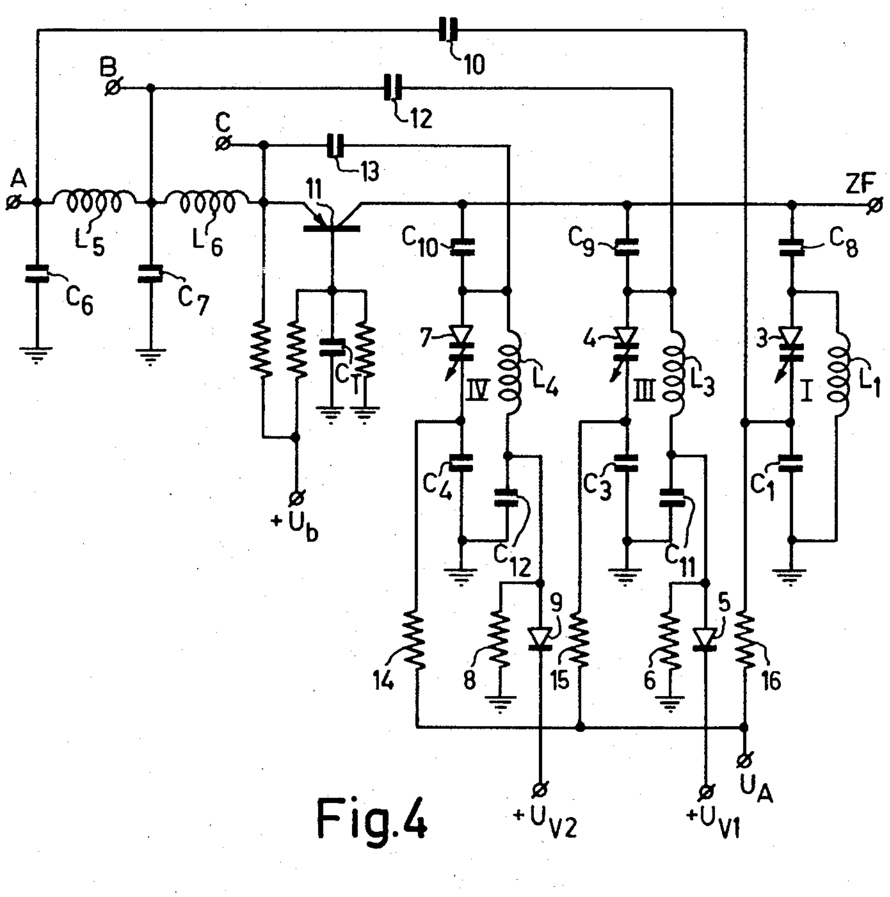
FIG. 4 shows a circuit arrangement for a tuning unit for the total range according to the invention.

The characteristic curve 1 in FIG. 1 constitutes the capacitance C as function of the tuning voltage U*a* of the variable capacity diode 3 in the circuit diagram according to FIG. 4 and in the resonant circuit I, hence for the range I (oscillator central frequency corresponding to the German standard/CCIR 87.15 MHz to 101.15 MHz).

The characteristic curve 2 is that of the variable capacity diode 4 (see circuit diagram of FIG. 4) without a bais and in the resonant circuit III, hence for the range III (oscillator central frequency corresponding to the German standard/CCIR 214.15 MHz to 263.15 MHz). The shaded part at the left denoted by I represents the range where the oscillator for reception in band I oscillates. The right-hand shaded part denoted by III shows the range (with a much lower capacity variation) where the oscillator for reception in band III oscillates.

Figure 2:
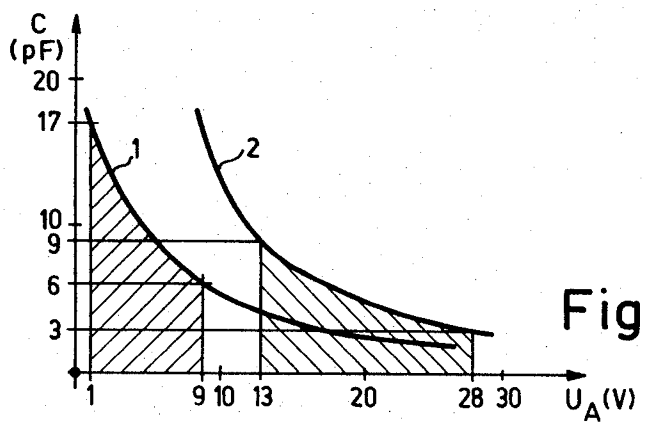

In FIG. 2 the characteristic curve 1 is that of the variable capacity diode 3 and the characteristic curve 2 is that of the variable capacity diode 4 with a bias. Without special steps, consequently with unchanged inductors $L_1$ and $L_3$ and only by addition of a bias $U_{V1}$ of for example 10 volt to the anode of variable capacity diode 4 a characteristic curve is obtained which already produces a capacity variation of 6 pF at a voltage variation of only 15 V.

Figure 3:
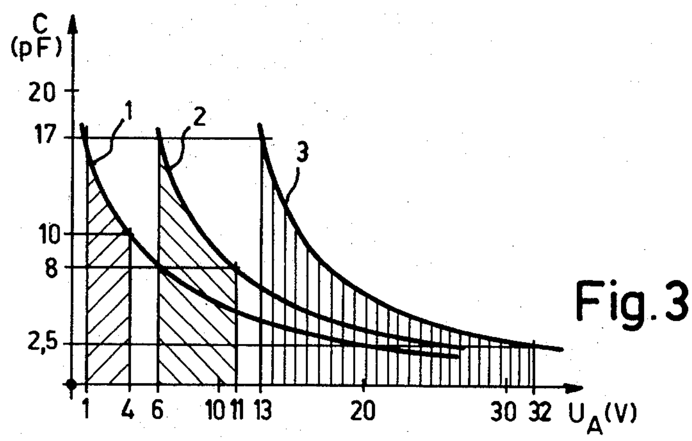
FIG. 3 shows a corresponding graph for a tuning unit for the total range for band I, III and band IV or V or bands IV and V while using the invention and with an optimum proportioning of the frequency-determining elements in each resonant circuit.

When, however, the frequency-determining elements in the resonant circuits, hence the inductor $L_1$ and the capacitor $C_1$ in the resonant circuit I, the inductor $L_3$ and the capacitor $C_3$ in the resonant circuit III, the inductor $L_4$ and the capacitor $C_4$ in the resonant circuit IV are proportioned in a correspondingly optimum manner, the characteristic curves according to FIG. 3 are obtained. The characteristic curve 1 for the variable capacity diode 3 in the resonant circuit I has approximately the same values as that according to FIG. 1.

The characteristic curve 2 for the variable capacity diode 4 then has, however, a useful range which is considerably shifted, because for an optimum proportioning of the circuit elements a capacity variation of 9 pF is obtained at a voltage variation of only 5 V. The characteristic curve 3 is that of the variable capacity diode 7 in the resonant circuit IV. A voltage variation of 19 V yields the completely usable capacity variation of 14.5 pF which renders tuning of the oscillator over approximately 490 MHz possible in the relevant frequency range at UHF, hence bands IV and V.

This characteristic curve according to FIG. 3 thus shows the use of the capacity variation of the separately used variable capacity diodes dependent on the applied voltage and always in the region where the capacity variation is greatest. The values of the tuning voltage $U_A$ plotted in FIGS. 1, 2 and 3 are applied to the terminal $U_A$ in the circuit arrangement according to FIG. 4. THe bias $+V_{V1}$ for band III and hence for the resonant circuit III was, for example, +5V and the resistor 6 had a value of, for example, 2Mohm. One MOhm may be the value of the operating resistor 8 for the diode 9 for generating the bias of the resonant circuit IV for the UHF range, hence for band IV or V or bands IV and V. The bias applied to the terminal $+U_{Vz}$ according to the arrangement of FIG. 4 was, for example, +12V (see FIG. 3); the range for band III thus begins at a bias of 5V and the oscillation occurs at 6V and ends at 11V. For the range IV or V or IV and V the bias is 12V, the oscillation begins at +13V and ends at +32V.

The circuit arrangement according to FIG. 4 operates in principle in the same manner as that described in German published Patent application 2,116.901. The feedback capacitor associated with the resonant circuit 1 with inductor 4, variable capacity diode 3 and capacitor $C_1$ is denoted in this case by 10 and the received frequency for the range I can be applied to the terminal A. Parts of the associated parallel resonant circuit at the input of the transistor 11 are the coil $L_5$ and the capacitors $C_6$ and $C_7$.

The feedback for the circuit III with inductor $L_3$, variable capacity diode 4 and capacitor $C_3$ is effected through a feedback capacitor 12. The input frequency in band III can be applied again to the terminal B. Parts of the parallel resonant circuit at the input are then essentially a coil $L_6$ and the capacitor $C_7$ together with the complex input impedance of the transistor 11.

The feedback capacitor for the resonant circuit IV (with inductor $L_4$, variable capacity diode 7 and capacitor $C_4$) for the range IV or V or IV and V is denoted by 13. The input frequency in this UHF range may be coupled to the terminal C and in this case the imaginary part of the input impedance of the transistor 11 always plays an important role in case of the very high frequencies. The capacitor $C_T$ at the base of the transistor must provide a short circuit to the common reference for all occurring frequencies. The intermediate frequency output signal obtained by mixing in the transistor 11 is derived from the collector through terminal ZF. The capacitors $C_{11}$ and $C_{12}$ in the resonant circuits III and IV are short circuits for high frequencies and only serve for the direct current separation of the bias $U_{V1}$ and $U_{V2}$.

The resistors 14, 15 and 16 are bias resistors which are commonly connected to the tuning voltage $U_a$ and serve for the supply of the tuning voltage to the subsequently arranged tunable variable capacity diodes 7, 4 and 3. Resistors 6 and 8 are connected to the capacitors $C_{11}$ and $C_{12}$, respectively, and serve for the charge or discharge of these capacitors to earth or to another suitable direct voltage (for example, $+Vb$).

The circuit arrangement according to FIG. 4 thus provides the possibility of realizing a common television tuner for VHF and UHF with one amplifying element (transistor 11) and a satisfactory separation of the resonant circuits mutually and with one single tuning extending over all ranges. This yields a very important advantage relative to the prior art in which two separate tuners are still present in each television receiver for VHF and UHF reception.

What is claimed is:

1. A circuit arrangement for an oscillator for at least two frequency ranges including an amplifying element in which a frequency-determining tuning circuit with an associated tuning element is connected to an output electrode of the amplifying element for each frequency range, the tuning elements being variable capacity diodes all of which are commonly operated, while for each tuning circuit a capacity feedback path is provided which leads from a point of the relevant tuning circuit to a parallel resonant circuit a branch of which incorporates the input electrodes of the amplifying element, means for ensuring that oscillation conditions are satisfied in only a part of the tuning range of each tuning circuit comprising the elements in the parallel resonant circuit and feedback paths having selected values, characterized in that at least one variable capacity diode is not only connected to a tuning voltage but also to a fixed bias.

2. A circuit arrangement as claimed in claim 1, characterized in that the bias is applied to the variable capacity diode through a bias diode which, viewed in the direction of the direct current path is arranged in the opposite direction relative to the relevant variable capacity diode.

3. A circuit arrangement as claimed in claim 1, characterized in that the frequency-determining elements in the tuning circuits are proportioned in such a manner that each tuning circuit is effective in the steepest possible part of the capacity variation curve of the associated variable capacity diode.

4. A circuit arrangement as claimed in claim 1, characterized in that an impedance relative to ground is connected to the input of the amplifying element in such a manner that this impedance constitutes a parallel resonant circuit with the input impedance of the amplifying element whose central frequency is located in the highest frequency range of the oscillator frequency to be generated and that the feedback capacitor is chosen to be such that the oscillation conditions are no longer satisfied below the lowest oscillator frequency to be generated in this frequency range.

5. A circuit arrangement as claimed in claim 1, characterized in that the values of the circuit elements of the tuning circuit located in the feedback path of the lowest frequency range are chosen to be such that they constitute a parallel resonant circuit with a narrow band whose central frequency lies so far below the highest frequency to be generated the lowest frequency range that the oscillation conditions above this highest frequency to be generated are no longer satisfied.

6. A circuit arrangement as claimed in claim 1, characterized in that at least in the frequency-determining tuning circuit for the lowest frequency range the capacity of the tuning circuit comprises the series arrangement of one of said variable capacity diodes and a fixed capacitor connected to ground, the feedback path being connected to the junction of the two capacitors.

7. A circuit arrangement as claimed in claim 1, further comprising means for applying an input signal for each frequency range to the end of the respective feedback capacitor remote from the associated frequency-determining tuning circuit, whereby said circuit comprises a self oscillating mixer.

8. An oscillator circuit for at least two frequency ranges said circuit comprising an amplifying element having input and output electrodes, a plurality of frequency-determining tuning circuits for said ranges respectively, each of said tuning circuits having an associated variable reactance tuning element coupled to said output electrode, all of the tuning elements being commonly controlled, a resonant circuit coupled to said input electrode, a plurality of feedback paths for said ranges respectively coupled from the respective tuning circuit to said resonant circuit, means for ensuring that oscillation conditions are satisfied in only a part of the tuning range of each tuning circuit comprising the resonant circuit and said feedback paths having selected values, and means for applying to at least one variable reactance element a fixed bias.

9. A circuit as claimed in claim 8 wherein said variable reactance elements comprise voltage variable diodes.

10. A circuit as claimed in claim 8 wherein said resonant circuit comprises a parallel resonant circuit.

11. A circuit as claimed in claim 8 wherein said feedback paths comprise capacitive feedback paths.

* * * * *